(12) United States Patent
Jeong

(10) Patent No.: US 12,069,906 B2
(45) Date of Patent: Aug. 20, 2024

(54) DISPLAY DEVICE

(71) Applicant: LG Display Co., Ltd., Seoul (KR)

(72) Inventor: DukYoung Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 93 days.

(21) Appl. No.: 17/539,934

(22) Filed: Dec. 1, 2021

(65) Prior Publication Data

US 2022/0199731 A1   Jun. 23, 2022

(30) Foreign Application Priority Data

Dec. 23, 2020   (KR) ........................ 10-2020-0181809

(51) Int. Cl.
*H10K 59/126* (2023.01)
*H10K 50/822* (2023.01)
*H10K 50/86* (2023.01)

(52) U.S. Cl.
CPC ......... *H10K 59/126* (2023.02); *H10K 50/822* (2023.02); *H10K 50/86* (2023.02)

(58) Field of Classification Search
None
See application file for complete search history.

(56) References Cited

U.S. PATENT DOCUMENTS

| | | | |
|---|---|---|---|
| 2011/0032461 A1* | 2/2011 | Cho | G01J 1/4228 420/556 |
| 2019/0310724 A1* | 10/2019 | Yeke Yazdandoost | H10K 59/65 |
| 2020/0185643 A1* | 6/2020 | Moon | G02F 1/133502 |
| 2021/0174049 A1* | 6/2021 | Hai | H10K 59/353 |
| 2021/0202621 A1* | 7/2021 | Liang | H10K 59/126 |
| 2021/0385314 A1* | 12/2021 | An | G06F 1/1618 |
| 2021/0408499 A1* | 12/2021 | Li | H04M 1/0264 |
| 2022/0069045 A1* | 3/2022 | Ebisuno | H10K 59/124 |
| 2022/0179452 A1* | 6/2022 | Srikanth | H04N 23/81 |
| 2022/0302420 A1* | 9/2022 | Ma | H10K 59/126 |

\* cited by examiner

*Primary Examiner* — Erik T. K. Peterson
*Assistant Examiner* — Christopher A. Schodde
(74) *Attorney, Agent, or Firm* — Birch, Stewart, Kolasch & Birch, LLP

(57) ABSTRACT

A display device includes a first area in which one or more first pixels are disposed, and a second area surrounded by the first area and in which one or more second pixels are disposed. The second area includes a first sensor area corresponding to a first sensor, and a second sensor area corresponding to a second sensor. Each of the first sensor area and the second sensor area includes a blocking layer different from each other.

20 Claims, 11 Drawing Sheets

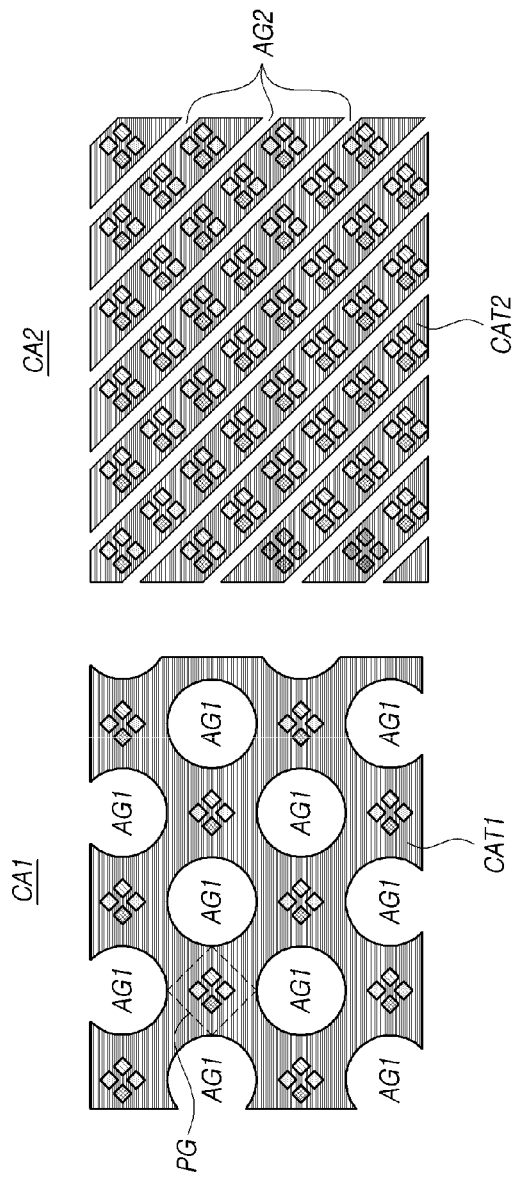

DISPLAY DEVICE

CROSS-REFERENCE TO RELATED APPLICATION

This application claims the priority benefit of Korean Patent Application No. 10-2020-0181809, filed on Dec. 23, 2020 in the Korean Intellectual Property Office, the entire contents of which are expressly incorporated herein by reference into the present application.

BACKGROUND

Field

The present disclosure relates to display devices.

Description of Related Art

Image display devices configured to display various information or data on a display screen act as a core device in the information and communication era. The display devices become thinner and lighter and are being developed to have high performance while being portable. Various needs for display devices for displaying an image have increased, and recently, various types of display devices, such as a Liquid Crystal Display device, an Organic Light Emitting Display device, a Quantum-dot Light Emitting Display device, or the like, have been developed and utilized.

Further, display devices are equipped with an input unit using a touch sensor or the like and an optical unit such as a camera, a proximity sensor, or the like in order to provide a user with more diverse application functions. However, due to the attachment of the optical unit to the display devices, there can be a limitation that the design of the display devices becomes somewhat difficult. In particular, since the camera and the proximity sensor may need to be exposed to the outside for the entrance for exiting of light, there can be a limitation in that an active area of the display panel may be inevitably reduced.

Accordingly, in some cases, a display device has been designed to i) have a large bezel for installation and exposure of an optical unit, ii) allow a portion of a display area to be cut out in a notch shape, or allow the optical unit to be exposed through a hole-shape portion formed in the active area. However, because the size of the display screen can still limited due to the camera, it is generally not easy to implement a full-screen display in reality.

SUMMARY OF THE DISCLOSURE

To implement a full-screen display, there is proposed a scheme of assigning a sensor area in which low-resolution pixels are disposed in a display screen and arranging a camera and/or various sensors in a position or area opposite to the sensor area under the display panel. However, due to structural limitations in the sensor area, light transmittance can be lowered, which can result in a limitation that the performance of various sensors can be deteriorated.

Accordingly, embodiments of the present disclosure provide display devices capable of substantially improving the performance of sensors employed in the display devices. Issues or problems being addressed by the present disclosure are not limited thereto, and other issues or problems being addressed by the present disclosure will become apparent to those skilled in the art from the following description.

In accordance with aspects of the present disclosure, a display device is provided. The display device includes a first area in which one or more first pixels are disposed, and a second area surrounded by the first area, in which one or more second pixels are disposed. The second area includes a first sensor area corresponding to a first sensor, and a second sensor area corresponding to a second sensor, and each of the first sensor area and the second sensor area includes a blocking layer different from each other.

The blocking layer can include one or more openings, and the remaining area except for the openings can serve to block a laser beam.

The first sensor can be an image sensor, and the second sensor can be an infrared sensor.

A first blocking layer of the first sensor area can be formed of a material having a visible light transmittance of 10% or less. In this instance, the first blocking layer can include at least one or more of molybdenum (Mo), titanium (Ti), or aluminum neodybium (AlNd).

A second blocking layer of the second sensor area can be formed of a material having an infrared transmittance of 90% or less. At this instance, the second blocking layer can include at least one or more of amorphous silicon (a-Si), zinc selenide (ZnSe), zinc sulfide (ZnS), magnesium oxide (MgO), gallium arsenic (GaAs), or gallium phosphide (GaP).

A density of pixels disposed in the first sensor area can be smaller than a density of pixels disposed in the second sensor area. A density of the pixels disposed in the second sensor area can be the same as a density of pixels disposed in the first area.

The first sensor area and the second sensor area include a light-transmitting area disposed between pixels, and a cathode of a light emitting element included in each pixel may not be disposed in the light-transmitting area.

The respective light-transmitting areas of the first sensor area and the second sensor area can have different shapes. For example, the light-transmitting area of the first sensor area can be circular or elliptical, and the light-transmitting area of the second sensor area can have a stripe shape extending in a horizontal, vertical, or slanted (e.g., diagonal) direction.

Various specific features, configurations, techniques and processes are included in detailed description and the accompanying drawings, and will be discussed in detail below.

In accordance with aspects of the present disclosure, it is possible to provide a display device equipped with various optical sensors or modules without a reduction in a display area. More specifically, according to embodiments described herein, it is possible to improve the performance of the sensors disposed in the display area. In accordance with aspects of the present disclosure, it is possible to provide a display device having improved aesthetics and functionality. Effects according to aspects of the present disclosure are not limited to the above description more various effects will be apparent in following description.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

FIG. 9 illustrates an opening area according to aspects of the present disclosure.

DETAILED DESCRIPTION OF THE EMBODIMENTS

Figure 1:
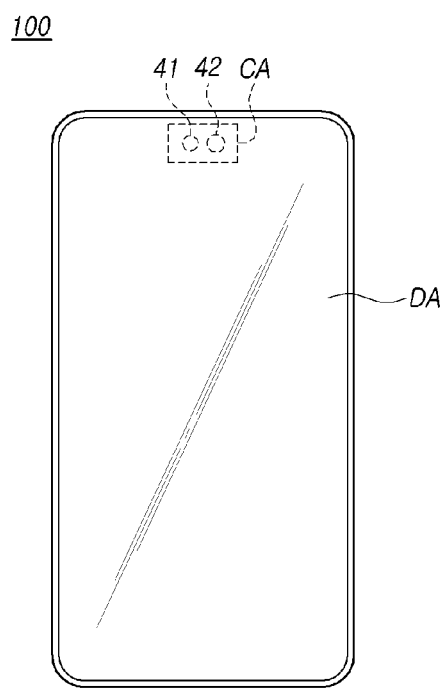
FIG. 1 illustrates schematically a display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but can be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description can make the subject matter in some embodiments of the present disclosure rather unclear. The terms such as "including", "having", "containing", "comprising of", and "consist of" used herein are generally intended to allow other components to be added unless the terms are used with the term "only". Singular forms used herein are intended to include plural forms unless the context clearly indicates otherwise. In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, can be used herein to describe one element or feature's relationship to another element(s) or feature(s) as illustrated in the figures, and it should be interpreted that one or more elements can be further "interposed" between the elements unless the terms such as 'directly', "only" are used. A location, arrangement, or disposition of a first element or layer "on" a second element or layer can include that not only is the first element or layer located, arranged, or disposed directly on the second element or layer, but a third element or layer is interposed between the first element or layer and the second element or layer. Herein, situations in which two or more elements included in embodiments of the present disclosure are connected, combined, coupled, contacted, or the like can include not only directly or physically connecting, combining, coupling, or contacting between two or more elements, but interposing of another element between the two or more elements.

When the terms, such as "first", "second", or the like, are used herein to describe various elements or components, it should be considered that these elements or components are not limited thereto. These terms are merely used herein for distinguishing an element from other elements and may not define order. Therefore, a first element mentioned below can be a second element in a technical concept of the present disclosure.

The size and thickness of each component shown in the drawings are illustrated for convenience of description, and thus, embodiments of the present disclosure are not necessarily limited thereto. Hereinafter, with reference to the accompanying drawings, various embodiments of the present disclosure will be described in detail.

Figure 2:
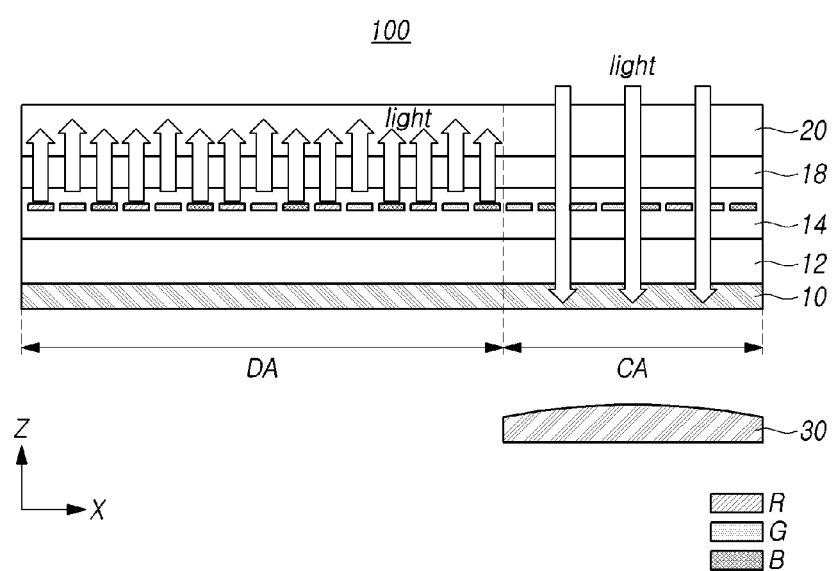
FIG. 2 is a cross-sectional view illustrating schematically a display panel and an optical sensor included in the display device according to aspects of the present disclosure.
Figure 3:
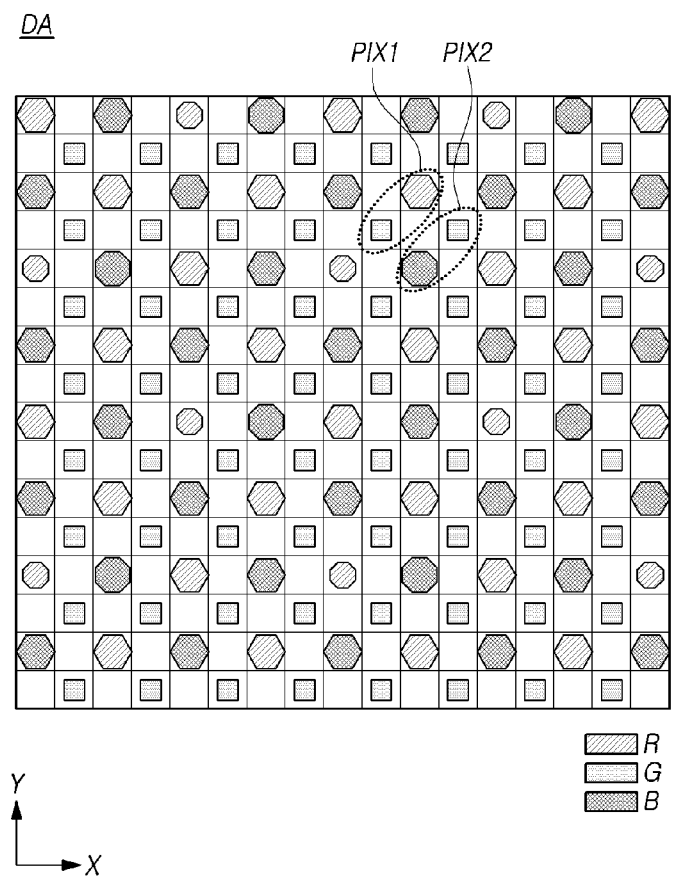
FIG. 3 illustrates pixels disposed in a display area of a display panel according to aspects of the present disclosure.

FIG. 1 illustrates schematically a display device according to aspects of the present disclosure. FIG. 2 is a cross-sectional view illustrating schematically a display panel and an optical sensor included in the display device. FIG. 3 illustrates pixels disposed in a display area of the display panel. All the components of each display device according to all embodiments of the present disclosure are operatively coupled and configured.

Referring to FIG. 1, the entirety of a surface of the display device 100, or most of the surface, can serve as a display area. The display area can include a first area DA and a second area CA. In this instance, both the first area DA and the second area CA can present images, but can have different resolutions from each other. For example, the resolution of multiple second pixels disposed in the second area CA can be lower than the resolution of multiple first pixels disposed in the first area DA. A sufficient amount of light corresponding to a degree to which the resolution of multiple second pixels disposed in the second area CA is lowered can be allowed to enter one or more sensors (41, 42) disposed in the second area CA. However, embodiments of the present disclosure are not limited thereto. For example, if the second area CA has sufficient light transmittance, or an algorithm suitable for noise compensation is implemented, the resolution of the second area CA can be substantially equal to the resolution of the first area DA.

The second area CA can be an area in which one or more sensors (41, 42) are disposed. The second area CA is an area overlapping one or more sensors; therefore, can have an area smaller than the first area DA in which most images are present. Each sensor (41, 42) can include at least one of an image sensor, a proximity sensor, an illuminance sensor, a gesture sensor, a motion sensor, a fingerprint recognition sensor, and a biometric sensor. For example, a first sensor 41 can be an image sensor for capturing still images or moving images, and a second sensor 42 can be an illuminance sensor; however, embodiments of the present disclosure are not limited thereto.

The second area CA can be placed at a location where the entrance of light is required. For example, the second area CA can be placed in an upper left portion or upper right portion of a display area, or placed across the entirety of an upper portion of the display area or most of the upper portion. In these situations, respective widths of these portions can be variously changed according to desired requirements. However, embodiments described herein are not limited thereto. For example, the second area CA can be placed in a central area or lower area of the display area. Hereinafter, the first area DA can be referred to as a display area, and the second area CA can be referred to as a sensor area.

The display area DA and the sensor area CA each can include one or more pixel arrays in which pixels to which pixel data are written are arranged. The number of pixels per unit area (e.g., Pixels Per Inch, PPI) of the sensor area CA can be lower than the PPI of the display area DA in order to ensure sufficient light transmittance.

Since both the display area DA and the sensor area CA include pixels, input images can be reproduced on the display area DA and the sensor area CA. Each of pixels in the display area DA and the sensor area CA can include sub-pixels having different colors to implement images with colors. Each sub-pixel can be one of a red sub-pixel (hereinafter, referred to as "R sub-pixel"), a green sub-pixel (hereinafter, referred to as "G sub-pixel"), and a blue sub-pixel (hereinafter, referred to as "B sub-pixel"). Each pixel P can further include a white sub-pixel (hereinafter, referred to as "W sub-pixel"). Each sub-pixel can include a pixel circuit and a light emitting element, such as a light emitting diode, more specifically, an organic light emitting diode (OLED).

The display panel has a width in an X-axis direction, a length in a Y-axis direction, and a thickness in a Z-axis direction. These directions can be perpendicular or substantially perpendicular to each other. The display panel can include a circuit layer 12 disposed on or over a substrate 10 and a light emitting element layer 14 disposed on or over the circuit layer 12. A polarizing layer 18 can be disposed on or over the light emitting element layer 14, and a cover glass 20 can be disposed on or over the polarizing layer 18.

The circuit layer 12 can include lines such as data lines, gate lines, and power lines, a pixel circuit connected to such lines, a gate driver connected to the gate lines, and the like. The circuit layer 12 can include circuit elements such as at least one transistor implemented as a thin film transistor (TFT), a capacitor, and the like. The lines and circuit elements of the circuit layer 12 can be implemented or disposed in or through a plurality of insulating layers, two or more metal layers separated by an insulating layer therebetween, and an active layer including a semiconductor material.

The light emitting element layer 14 can include a light emitting element driven by the pixel circuit, for example, a light emitting diode, more specifically an organic light emitting diode (OLED), or the like. The light emitting element can be implemented as the organic light emitting diode (OLED). The OLED can include an organic material layer formed between an anode and a cathode. The organic material layer can include a hole injection layer (HIL), a hole transport layer (HTL), an emission layer (EML), an electron transport layer (ETL), and an electron injection layer (EIL); however, embodiments of the present disclosure are not limited thereto. When voltages are applied to the anode and cathode of the OLED, holes passing through the hole transport layer (HTL) and electrons passing through the electron transport layer (ETL) can move to the emission layer (EML), and then form excitons. Thereby, visible light can be emitted from the emission layer (EML). The light emitting element layer 14 can be disposed on or over pixels that selectively transmit respective wavelengths of red light, green light, and blue light, and further include a color filter array.

The light emitting element layer 14 can be covered by an encapsulation layer. The encapsulation layer can have a structure in which an organic film and an inorganic film are alternately stacked. In this instance, the inorganic film can serve to block the penetration of moisture or oxygen, and the organic film can serve to flatten a surface of the inorganic film. In the structure having the multilayer stacked with the organic film and the inorganic film, a path through which moisture or oxygen travels can become longer than that in a structure having a single layer, and therefore, the penetration of moisture/oxygen affecting the light emitting element layer 14 can be effectively prevented.

The polarizing layer 18 can be bonded on the light emitting element layer 14 or the encapsulation layer. The polarizing layer 18 can serve to improve outdoor visibility of the display device. The polarizing layer 18 can serve to reduce light reflected from the surface of the display panel and block light reflected from the metal of the circuit layer 12 to improve brightness of pixels. The polarizing layer 18 can be implemented as a linear polarizing plate 18, a polarizing plate 18 on which a phase delay film is bonded, or a circular polarizing plate 18.

The display device 100 according to aspects of the present disclosure can include an optical sensor disposed under a display screen. The optical sensor can capture external images in a capture mode and supply photographic or moving image data. The optical sensor can correspond to, and be located under, the sensor area CA. In this situation, a lens 30 of the optical sensor can face the sensor area CA. The external light can enter the lens of the optical sensor through the sensor area CA, and the lens 30 can condense the light to the image sensor. Meanwhile, in a situation where the resolution of the sensor area CA is reduced to ensure light transmittance, an image quality compensation algorithm can be applied for compensating for the luminance and color coordinates of pixels in the sensor area CA.

According to embodiments described herein, as pixels are also disposed in the sensor area CA, a full-screen display can be implemented without limitation in the display area due to an optical sensor.

As illustrated in FIG. 3, the display area DA can include pixels arranged in a matrix pattern. Each of the pixels can be implemented as a real-type pixel including R, G, and B subpixels of three primary colors, which make up one pixel. Each of the pixels can further include a W sub-pixel. Further, two sub-pixels can make up one pixel using a sub-pixel rendering algorithm. For example, a first pixel PIX1 can be made up of R and G sub-pixels, and a second pixel PIX2 can be made up of B and G sub-pixels. Insufficient color representation in each of the pixels PIX1 and PIX2 can be compensated for by an average value of corresponding color data between neighboring pixels.

Figure 4:
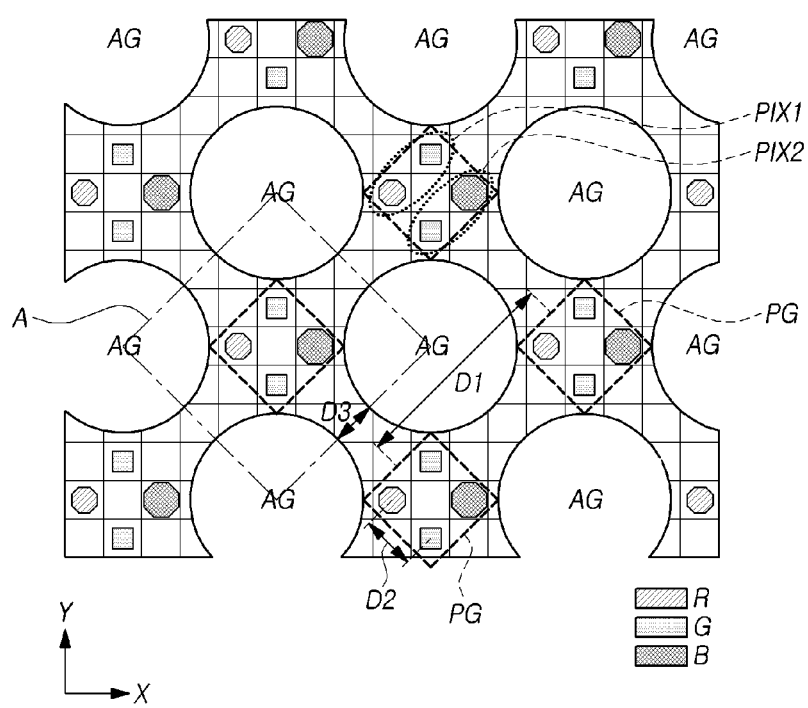
FIG. 4 illustrates pixels in a sensor area, and a light-transmitting area according to aspects of the present disclosure.
Figure 5:
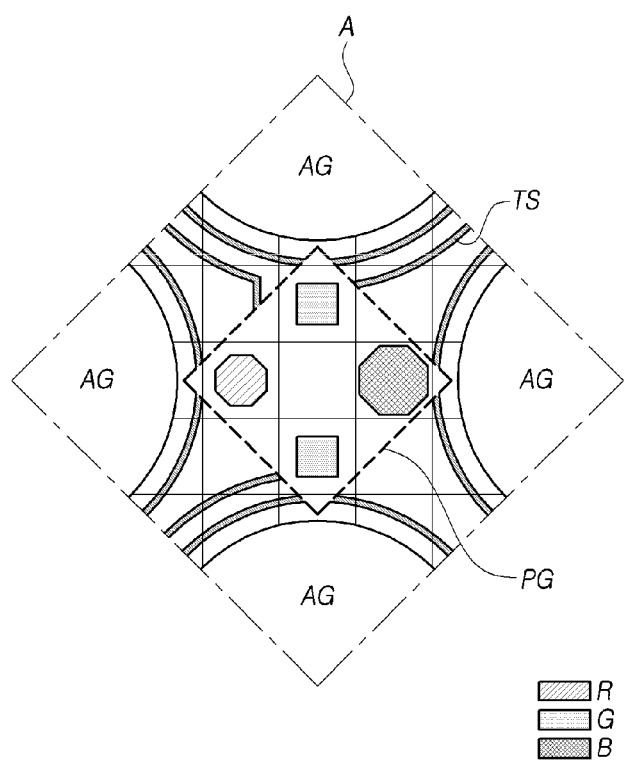
FIG. 5 is an enlarged view of portion A in FIG. 4.

FIG. 4 illustrates a sensor area according to aspects of the present disclosure. FIG. 5 is an enlarged view of portion A in FIG. 4.

Referring to FIGS. 4 and 5, the sensor area CA can include one or more pixel groups PG, each of which includes one or more pixels, spaced apart by a predetermined distance D1 from one another, and one or more light-transmitting areas AG disposed between neighboring pixel groups PG. The light-transmitting area AG can be disposed between pixels. In this manner, more sufficient external light can enter the lens of the optical sensor through the light-transmitting area AG. A shape of the light-transmitting area AG is illustrated in a circular shape; however, embodiments of the present disclosure are not limited thereto. For example, the light-transmitting area AG can be designed in various shapes such as a circle, an ellipse, a polygon, and the like.

The light-transmitting area AG can include one or more transparent materials having high light transmittance for enabling light to enter the light-transmitting area AG such that a loss of the incident light is minimized. For example, the light-transmitting area AG can include transparent insulating materials without including metal lines or pixels. In this instance, the lines TS of the pixels can be disposed outside of the light-transmitting area AG. However, embodiments herein are not limited thereto; for example, a metal electrode material can remain in a partial area in the light-transmitting area AG. In this manner, the amount of light incident on the sensor through the light-transmitting area can increase, and the light transmittance of the sensor area CA can increase as the light-transmitting area AG increases.

Each pixel group PG can include one or two pixels. Further, each of the pixels can include two to four sub-pixels. For example, each pixel in each pixel group can include all of the R, G, and B sub-pixels, or can include two of the R, G, and B sub-pixels. According to implementations, each pixel can further include W sub-pixel.

A distance D3 between the light-transmitting areas AG can be smaller than a distance (e.g., a pitch) D1 between the pixel groups PG. A distance D2 between the sub-pixels can be smaller than the distance D1 between the pixel groups PG.

Figure 6:
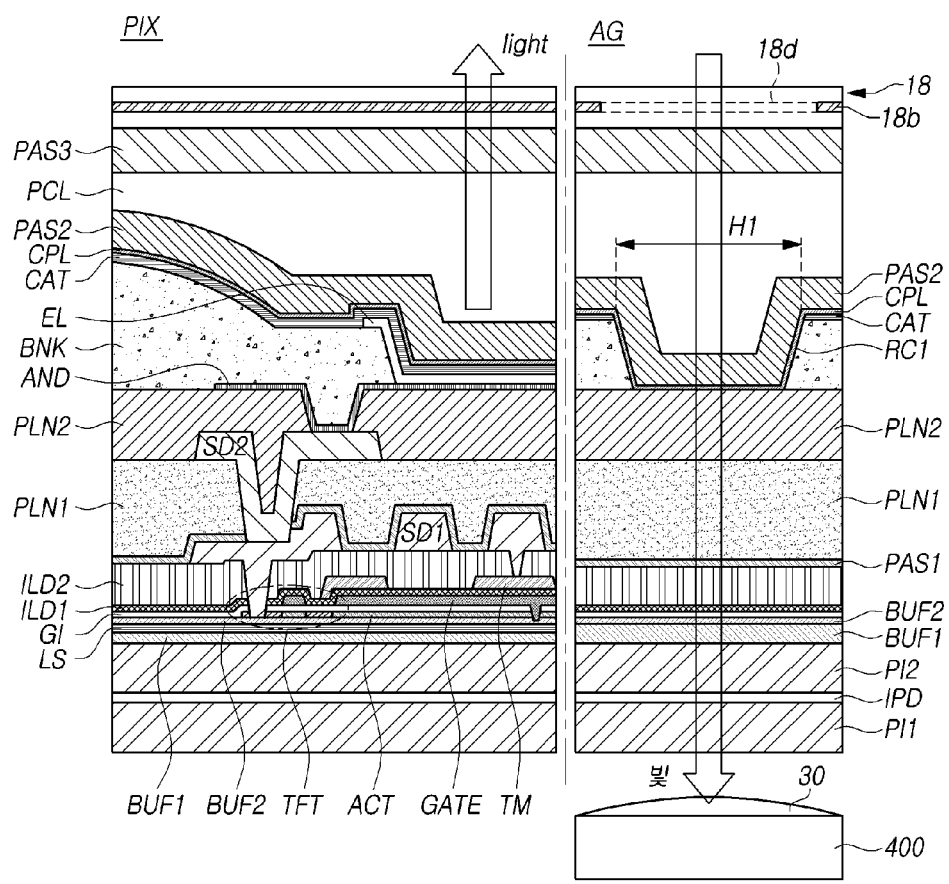
FIG. 6 illustrates a cross-sectional structure of a pixel area and a light-transmitting area according to aspects of the present disclosure.

FIG. 6 illustrates a cross-sectional structure of a pixel area and a light-transmitting area according to aspects of the present disclosure.

The cross-sectional structures of the display device 100 according to embodiments described herein are not limited to the structure in FIG. 6. For example, FIG. 6 illustrates a driving transistor DT of a pixel circuit.

Referring to FIG. 6, a circuit layer, a light emitting element layer, and the like can be stacked on or over at least one substrates (PI1, PI2) in a pixel area PIX. The substrate can include a first PI substrate PI1 and a second PI substrate PI2. An inorganic film IPD can be disposed between the first PI substrate PI1 and the second PI substrate PI2. The inorganic film IPD can block the penetration of moisture.

A first buffer layer BUF1 can be disposed on the second PI substrate PI2. A first metal layer LS can be disposed on the first buffer layer BUF1, and a second buffer layer BUF2 can be disposed on the first metal layer LS. Each of the first and second buffer layers BUF1 and BUF2 can be formed of an inorganic insulating material, and can include one or more insulating layers.

The first metal layer LS can be patterned in a photo-lithography process. The first metal layer LS can include a light shield pattern. The optical shield pattern can block external light so that light cannot be irradiated to an active layer of the transistor, such as a thin film transistor (TFT), thereby preventing a photo current of the TFT disposed in the pixel area. When the light shield pattern is formed of a metal having a lower absorption coefficient of a laser wavelength used in a laser ablation process than a metal layer (e.g. a cathode electrode) to be removed from the sensor area CA, the light shield pattern can also serve as a shielding layer that blocks a corresponding laser beam LB in the laser ablation process.

The active layer ACT can be formed of a semiconductor material on the second buffer layer BUF2 and patterned by a photo-lithography process. The active layer ACT can include an active pattern of each of one or more TFTs of the pixel circuit and one or more TFTs of a gate driver. A part of the active layer ACT can be metallized by ion doping. The metallized part can be used as a jumper pattern for connecting metal layers at some nodes of the pixel circuit, thus connecting one or more elements of the pixel circuit.

A gate insulating layer GI can be disposed on the second buffer layer BUF2 to cover the active layer ACT. The gate insulating layer GI can be formed of an inorganic insulating material.

A second metal layer GATE can be disposed on the second gate insulating layer GI. The second metal layer GATE can be patterned by the photolithography process. The second metal layer GATE can be used as a gate line, a gate electrode, a lower electrode of a storage capacitor Cst1, a jumper pattern connecting respective patterns of the first metal layer LS and a third metal layer TM, or the like.

A first interlayer insulating layer ILD1 can be disposed on the gate insulating layer GI to cover the second metal layer GATE. The third metal layer TM can be disposed on the first interlayer insulating layer ILD2, and a second interlayer insulating layer ILD2 can cover the third metal layer TM. The third metal layer TM can be patterned by the photolithography process. The third metal layer TM can include metal patterns equal to those of an upper electrode of the storage capacitor Cst1. The first and second interlayer insulating layers ILD1 and ILD2 can include an inorganic insulating material.

A fourth metal layer SD1 can be disposed on the second interlayer insulating layer ILD2, and an inorganic insulating layer PAS1 and a first planarization layer PLN1 can be stacked on or over at least one of the fourth metal layer SD1 and the second interlayer insulating layer ILD2. A fifth metal layer SD2 can be disposed on the first planarization layer PLN1.

One or more patterns of the fourth metal layer SD1 can be connected to the third metal layer TM through a contact hole formed in the first planarization layer PLN1 and the inorganic insulating layer PAS1. The first and second planarization layers PLN1 and PLN2 can be formed of an organic insulating material that flattens a surface.

The fourth metal layer SD1 can include first and second electrodes of the TFT that is connected to the active pattern of the TFT through a contact hole formed in the second interlayer insulating layer ILD2. Data lines and power lines can be implemented with the fourth metal layer SD1 or the fifth metal layer SD2.

An anode electrode AND, which is a first electrode layer of a light emitting element OLED, can be disposed on the second planarization layer PLN2. The anode electrode AND can be connected to one electrode of the driving TFT through a contact hole formed in the second planarization layer PLN2. The anode electrode AND can include a transparent or translucent electrode material.

A pixel defining film BNK can cover the anode electrode AND of the light emitting element OLED. The pixel defining film BNK can be formed in a pattern defining a light emitting area (or an opening area) through which light passes from each pixel to the outside. A spacer SPC can be formed on the pixel defining film BNK. The pixel defining film BNK and the spacer SPC can be integrated with the same organic insulating material. The spacer SPC can ensure a gap between a fine metal mask (FMM) and the anode electrode AND so that the FMM cannot contact the anode electrode AND in the deposition process of an organic compound EL.

The organic compound EL can be formed in a light emitting area of each pixel defined by the pixel defining film BNK. A cathode electrode CAT, which is the second electrode layer of the light emitting element OLED, can be disposed to cover the pixel defining film BNK, the spacer SPC, and the organic compound EL in the display device 100. The cathode electrode CAT can be connected to a VSS line formed with any one of the lower metal layers. A capping layer CPL can cover the cathode electrode CAT. The capping layer CPL can be formed of an inorganic insulating material, and can protect the cathode electrode CAT by blocking air and outgassing of the organic insulating material applied on the capping layer CPL from penetrating to the cathode electrode CAT.

An encapsulation layer can include inorganic insulating layers PAS2 and PAS3 and a foreign material compensation layer PCL disposed between the inorganic insulating layers PAS2 and PAS3. The lower inorganic insulating layer PAS2 can cover the capping layer CPL, and the foreign material compensation layer PCL can be disposed on the lower inorganic insulating layer PAS2. The foreign material compensation layer PCL can include an organic insulating material. The upper inorganic insulating layer PAS3 can be disposed on the foreign material compensation layer PCL.

A polarizing plate 18 can be disposed on the inorganic insulating layer PAS3 to improve outdoor visibility of the display device 100. The polarizing plate 18 can reduce light reflected from the surface of the display device 100 and block light reflected from the metal of the circuit layer 12, leading to improving brightness of pixels. Referring to FIG. 6, a first light-transmitting pattern 18d can be formed on the polarizing plate 18 in the light-transmitting area AG. The first light-transmitting pattern 18d can be formed due to a variance in colors of a polarizer 18b by a laser, or can be formed by the partial removing of the polarizer 18b.

An opening H1 can be formed in the cathode electrode CAT in the light-transmitting area AG. The opening H1 is formed by etching the cathode electrode CAT and the pixel defining film BNK at once after the cathode electrode CAT on the pixel defining film BNK are formed. Accordingly, a first groove RC1 can be formed in the pixel defining film BNK, and the opening H1 of the cathode electrode CAT can be formed on the first groove RC1. However, embodiments described herein are not limited thereto. For example, the pixel defining layer may not be disposed in the light-transmitting area AG, and the cathode electrode CAT can be disposed on the second planarization layer PLN2.

In some embodiments, in the light-transmitting area AG, the first light-transmitting pattern 18d can be disposed in the polarizing plate 18, and the opening H1 can be formed in the cathode electrode. Thereby, light transmittance can be improved. Accordingly, since a sufficient amount of light is allowed to enter a camera module 400, camera performance can be improved. Further, noises of the captured image data can be reduced.

Figure 7:
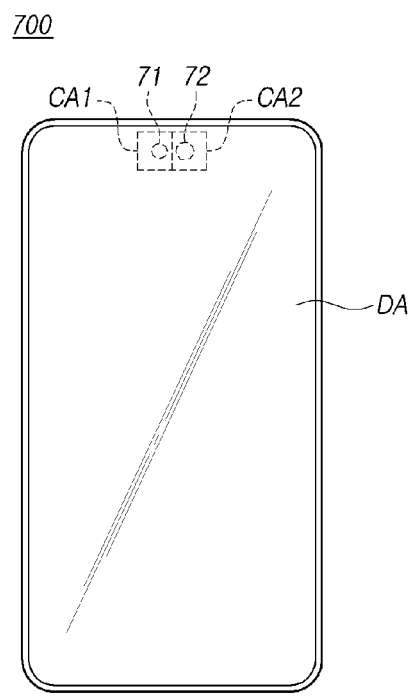
FIG. 7 is a plan view illustrating the display device according to aspects of the present disclosure.

FIG. 7 is a plan view illustrating the display device according to aspects of the present disclosure.

Referring to FIG. 7, the display device 700 according to embodiment described herein can include a first area DA and a second area CA, and the second area CA is or includes a first sensor area CA1 and a second sensor area CA2. All the first area DA, the first sensor area CA1, and the second sensor area CA2 are areas in which an image is displayed. In one embodiment, the first sensor area CA1 and the second sensor area CA2 are areas corresponding to respective sensors different from each other, e.g., they are areas in which the different sensors are respectively associated with or disposed.

The first area DA and the second area CA are equal to the above description discussed with reference to FIG. 1. All or each of the first sensor area CA1 and the second sensor area CA2 can overlap one or more sensors (an image sensor, an infrared sensor, etc.). In order to maximize the amount of light incident to at least one sensor under the substrate, resolution of the first sensor area CA1 and the second sensor area CA2 can be lower than resolution of the first area DA.

In one design, when several sensors are arranged in the second area CA, the second area CA has been designed without considering the characteristics of each sensor. For example, the entire second area CA has been formed of the same material and structure. In such a structure, for example, there has occurred a problem that one sensor has no problem, but the other sensor has deteriorated characteristics. For example, in a situation where an image sensor and an infrared sensor are disposed together in the second area CA, if conditions such as transmittance are optimized for the image sensor, the infrared sensor can have difficulty in exhibiting sufficient performance.

The inventor of the present disclosure recognized this limitation and invented a scheme to allow all sensors to exhibit best performance by designing respective areas corresponding to sensors to have different structures from one another. The above scheme includes uniquely designing materials and shapes of metals (a blocking layer, a cathode, etc.) disposed in each sensor area.

In general, in order to improve the transmittance of the second area CA, it can be desired to remove all metallic materials of the light-transmitting areas AG in the second area CA. In particular, a metal used as a cathode electrode can be deposited over the entire second area CA, and then an area corresponding to the light-transmitting area AG can be removed in a laser ablation process. At this time, if the laser beam is irradiated with a point shot on the light-transmitting area AG, an associated process time can be lengthened. Further, transmittance can be lowered due to a metal residual film remaining in the light-transmitting area AG, or noises included in images can increase. In order to solve this problem in the process, a blocking layer (the first metal layer LS in FIG. 6) exposing only the light-transmitting area AG can be formed, and in the laser ablation process, a process of irradiating a laser beam in the form of a line beam or a block beam can be used. At this time, a metal present in an area other than the light-transmitting area AG may not be removed because this metal is protected from the laser beam by the blocking layer LS. In such a process, the metal corresponding to only the light-transmitting area AG can be removed with only one irradiation of the laser beam.

After the metal corresponding to the light-transmitting area AG of the sensor area CA is removed, as the blocking layer LS blocks external light under an associated TFT so that no light is irradiated to an active layer ACT. It is therefore possible to prevent a photo current of the TFT.

The inventor of the present disclosure recognized that when various sensors are arranged in a sensor area, if an entire second area CA is provided with a blocking layer LS of the same material and structure, this implementation may poorly affect the performance of at least one of the sensors. Furthermore, the inventor grasped that if the materials and/or shapes of blocking layers LS are configured differently depending on respective sensors disposed in corresponding areas, the respective performance of the sensors can be maximized.

In the display device 700 according to aspects of the present disclosure, a technique is provided for optimizing functionality of each sensor by applying a blocking layer separate from one another to each sensor area in a second are CA. Further, the blocking layer can be used to pattern an associated cathode by a laser process using line beam or block beam as described above.

The display device 700 includes first pixels disposed in a first area DA, and second pixels disposed in a second area CA surrounded by the first area DA. The second area CA2 includes a first sensor area CA1 corresponding to a first sensor 71 and a second sensor area CA2 corresponding to a second sensor 72. The first sensor area CA1 and the second sensor area CA2 can have different blocking layers.

Figure 8:
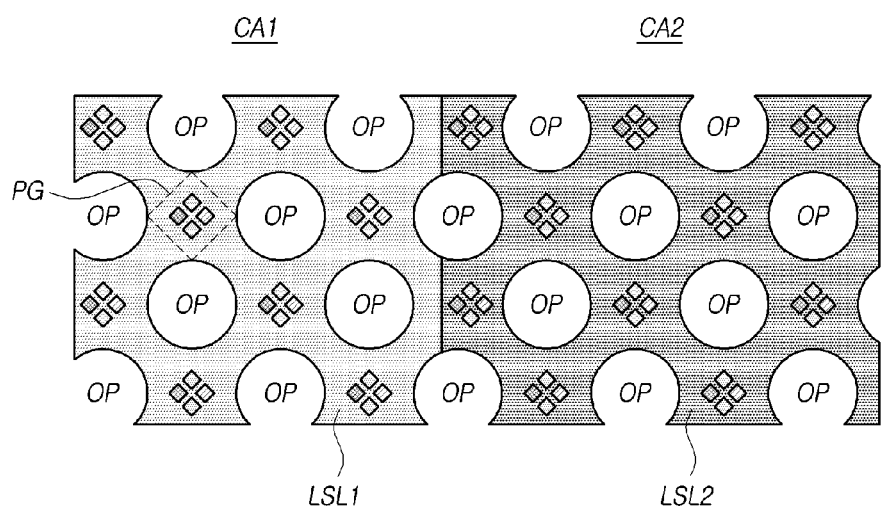
FIG. 8 illustrates a blocking layer according to aspects of the present disclosure.

FIG. 8 illustrates a blocking layer according to aspects of the present disclosure.

Referring to FIG. 8, the blocking layer (LSL1, LSL2) can include at least one opening OP corresponding to a light-transmitting area AG. The opening OP is an area not overlapping a pixel PG, in which the blocking layer is not formed. In FIG. 8, although respective blocking layers disposed in the first sensor area CA1 and the second sensor area CA2 have the same opening shape; however, embodiments of the present disclosure are not limited thereto. In the laser ablation process of removing a metal present in a light-transmitting area AG, the blocking layer (LSL1, LSL2) can serve to block the irradiation of a laser beam toward the remaining area except for at least one opening OP. Accordingly, the blocking layer (LSL1, LSL2) can be formed of a metal or inorganic film having a lower absorption coefficient for a wavelength of the laser beam than the metal that is removed.

The first sensor area CA1 and the second sensor area CA2 can have different blocking layers depending on respective sensors. For example, the first sensor 71 can be an image sensor, and the second sensor 72 can be an infrared sensor, which can be used to recognize a user's face. In this instance, a first blocking layer LSL1 of the first sensor area CA1 can be formed of a material having a visible light transmittance of 10% or less. This is to prevent image quality deterioration due to scattering and interference of visible light, and at least one of molybdenum (Mo), titanium (Ti), or aluminum neodybium (AlNd) can be used as the first blocking layer LSL1.

Further, when the second sensor 72 is an infrared sensor, a second blocking layer LSL2 of the second sensor area can be formed of a material having an infrared transmittance of 90% or more. At this instance, the second blocking layer LSL2 can include at least one or more of amorphous silicon (a-Si), zinc selenide (ZnSe), zinc sulfide (ZnS), magnesium oxide (MgO), gallium arsenic (GaAs), or gallium phosphide (GaP).

The first sensor area CA1 and the second sensor area CA2 can be implemented with the same resolution (e.g., lower resolution than the first area). In another embodiment, differently from this, the first sensor area CA1 and the second sensor area CA2 can be implemented with different resolutions from each other. As a recognition rate can be maintained even when pixels are arranged to have a higher resolution in an area where a specific sensor (e.g., an infrared sensor) is placed, it can be more advantageous not to degrade the display quality for such an area in which the specific sensor is disposed.

Accordingly, in the display device 700 according to embodiments described herein, a density of pixels disposed in the first sensor area CA1 can be lower than a density of the pixels disposed in the second sensor area CA2. When an image sensor is disposed in the first sensor area CA1 and an infrared sensor is disposed in the second sensor area CA2, a PPI of the first sensor area CA1 can be smaller than a PPI of the second sensor area CA2. Further, a density of pixels disposed in the second sensor area CA2 can be the same as a density of pixels disposed in the first area DA. This is for the convenience of design/manufacturing.

FIG. 9 illustrates an opening area according to aspects of the present disclosure.

Referring to FIG. 9, a first sensor area CA1 and a second sensor area CA2 include light-transmitting areas AG disposed between pixels, and shapes of the light-transmitting areas AG can be different in respective areas. The light-transmitting area AG1 of the first sensor area CA1 is circular or elliptical. The light-transmitting area AG2 of the second sensor area CA2 has a stripe or square shape extending in a horizontal, vertical or diagonal (or some other slanted) direction.

Cathodes (e.g., CAT1 and CAT2) of a light emitting element included in the second pixels may not be disposed in the light-transmitting areas AG1 and AG2. When the cathode is patterned, an opening OP can be formed in blocking layers LSL1 and LSL2 in such a shape. When the light-transmitting area AG is disposed as shown in FIG. 9, the first blocking layer LSL1 of the first sensor area CA1 can have a circular opening, and the second blocking layer LSL2 of the second sensor area CA2 can have an opening with a diagonal stripe shape.

Figure 10A:
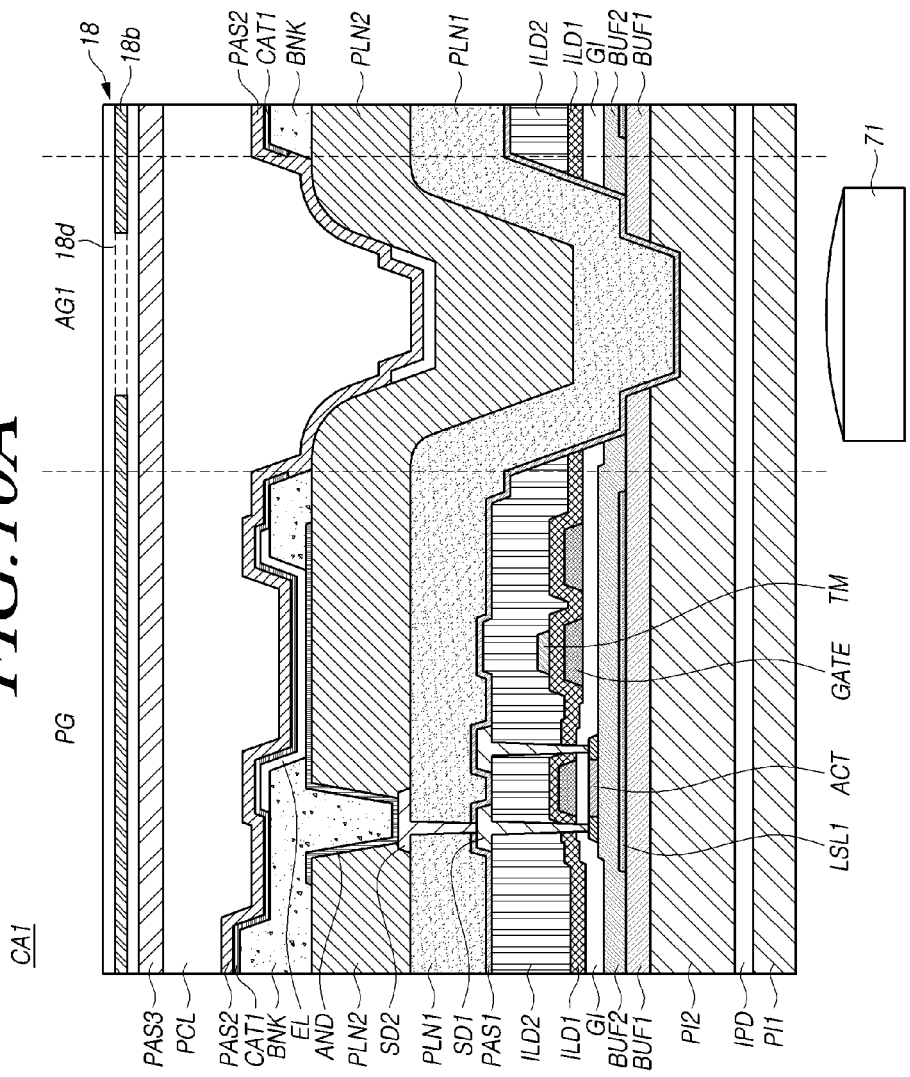
FIGS. 10A and 10B illustrate cross-sectional structures of sensor areas according to aspects of the present disclosure.
Figure 10B:
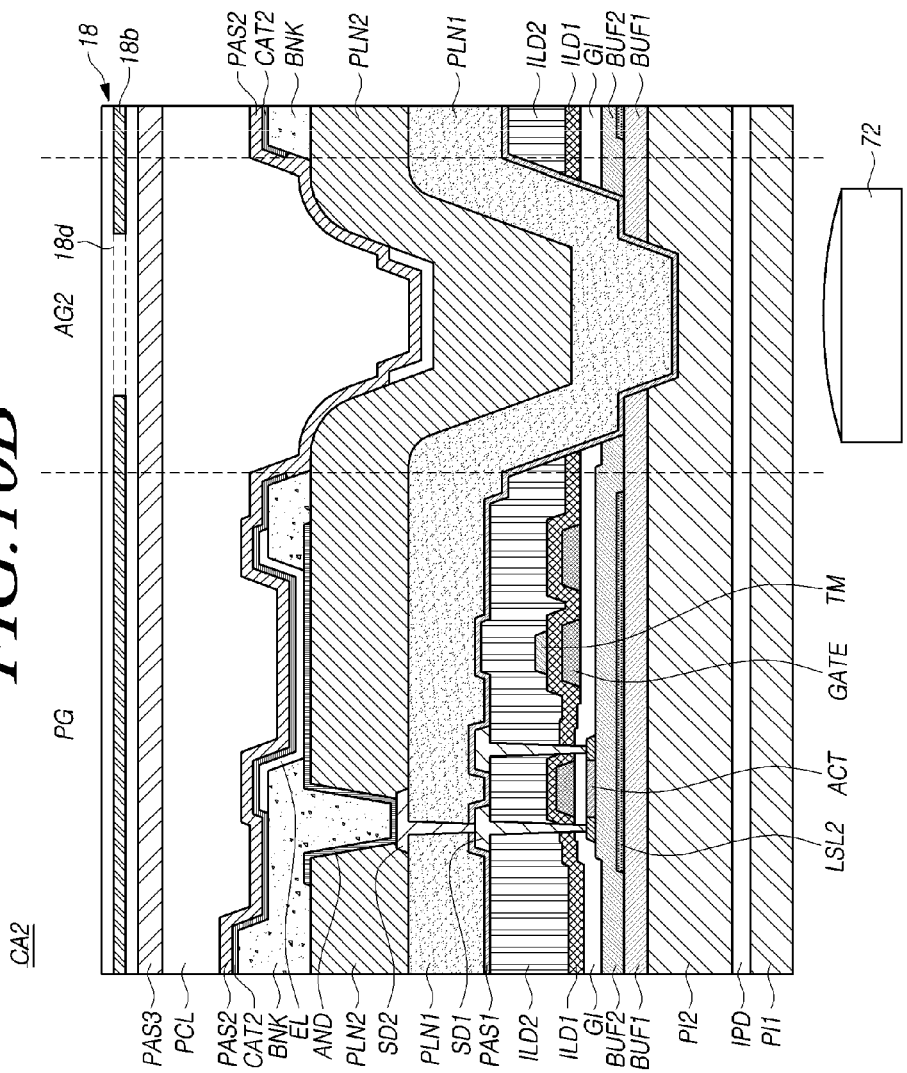

FIGS. 10A and 10B illustrate cross-sectional structures of sensor areas according to aspects of the present disclosure.

Particularly, FIG. 10A illustrates a first sensor area CA1 in which an image sensor 71 is disposed. FIG. 10B illustrates a second sensor area CA2 in which an infrared sensor 72 is disposed. Each of the layers in the structures shown in FIGS. 10A and 10B except for blocking layers LSL1 and LSL2 and sensors 71 and 72 is equal to that of FIG. 6. Thus, corresponding discussions are omitted or may be provided briefly for convenience of description.

As described above, respective blocking layers LSL1 and LSL2 in the first sensor area CA1 and the second sensor area CA2 can be formed of different materials depending on corresponding sensors. For example, the blocking layer LSL1 of the first sensor area CA1 can be formed of a material having less interference and scattering of visible light in order to reduce noises of the image sensor. For example, the blocking layer LSL2 of the second sensor area CA1 can be formed of a material having a high infrared transmittance in order to increase a recognition rate of the infrared sensor.

Each of the blocking layers LSL1 and LSL2 can block external light from entering an upper portion of an active layer ACT of a pixel area PG, serving to prevent a photo current of an associated TFT.

Further, respective blocking layers LSL1 and LSL2 of the first sensor area and the second sensor area can have an opening OP with a shape corresponding to a shape of an upper portion of a light-transmitting area AG. Accordingly, each sensor area can have a shape of a light-transmitting area AG designed according to its function.

In the display device according to embodiments described herein, the recognition performance of each sensor can be improved by providing an environment suitable for each sensor through the above-described configurations.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention.

Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

The scope of protection of the present disclosure is to be construed according to the claims, and all technical ideas within the scope of the claims should be interpreted as being included in the scope of the present invention.

What is claimed is:

1. A display device comprising:
   a first area in which one or more first pixels are disposed; and
   a second area in which one or more second pixels are disposed, the second area being surrounded by the first area,
   wherein the second area includes a first sensor area corresponding to a first sensor, and a second sensor area corresponding to a second sensor,
   wherein a first blocking layer in the first sensor area is different than a second blocking layer in the second sensor area,
   wherein at least one planarization layer is disposed continuously across the first sensor and the second sensor, the at least one planarization layer including a first depression overlapping with the first sensor and a second depression overlapping with the second sensor, and
   wherein the at least one planarization layer is disposed between a transistor and the one or more second pixels, and a portion of the at least one planarization layer extends through a hole in at least one of first blocking layer and the second blocking layer.

2. The display device according to claim 1, wherein a remaining area excluding the hole includes a light shield pattern.

3. The display device according to claim 1, wherein the first sensor is an image sensor, and the second sensor is an infrared sensor.

4. The display device according to claim 3, wherein the first blocking layer of the first sensor area is formed of a material having a visible light transmittance of 10% or less.

5. The display device according to claim 4, wherein the first blocking layer includes at least one or more of molybdenum (Mo), titanium (Ti), or aluminum neodymium (AlNd).

6. The display device according to claim 4, wherein the second blocking layer of the second sensor area is formed of a material having an infrared transmittance of 90% or less.

7. The display device according to claim 6, wherein the second blocking layer includes at least one or more of amorphous silicon (a-Si), zinc selenide (ZnSe), zinc sulfide (ZnS), magnesium oxide (MgO), gallium arsenic (GaAs), or gallium phosphide (GaP).

8. The display device according to claim 1, wherein a density of pixels disposed in the first sensor area of the one or more second pixels is less than a density of pixels disposed in the second sensor area of the one or more second pixels.

9. The display device according to claim 8, wherein the density of the pixels disposed in the second sensor area of the one or more second pixels is equal to a density of the one or more first pixels disposed in the first area.

10. The display device according to claim 8, wherein each of the first sensor area and the second sensor area includes a light-transmitting area disposed between the first pixels or the second pixels, and
    a cathode of a light emitting element included in each of the first pixels or the second pixels is not disposed in the light-transmitting area.

11. The display device according to claim 10, wherein the first sensor area and the second sensor area have different light-transmitting area shapes.

12. The display device according to claim 11, wherein the light-transmitting area of the first sensor area is circular or elliptical, and
    the light-transmitting area of the second sensor area has a stripe shape extending in a horizontal, vertical, or slanted direction.

13. The display device according to claim 1, further comprising:
    a polarizer disposed over the one or more first pixels and the one or more second pixels,
    wherein the polarizer includes a first hole overlapping with the first sensor and a second hole overlapping with the second sensor.

14. The display device according to claim 1, further comprising:
    at least one insulating layer disposed between the at least one planarization layer and the first and second sensors,
    wherein a portion of at least one of the first depression and the second depression extends through a hole in the at least one insulating layer overlapping with the first sensor or the second sensor.

15. The display device according to claim 1, further comprising:
    at least one substrate disposed between the at least one planarization layer and the first and second sensors,
    wherein the at least one substrate includes a first divot overlapping with the first sensor and a second divot overlapping with the second sensor.

16. The display device according to claim 15, wherein a width of the first divot is smaller than a width of a first hole in the first blocking layer in the first sensor area, or a width of the second divot is smaller than a width of a second hole in the second blocking layer in the second sensor area.

17. The display device according to claim 1, wherein the first blocking layer in the first sensor area includes a different material than the second blocking layer in the second sensor area, and
    wherein the first blocking layer in the first sensor area and the second blocking layer in the second sensor area are disposed on a same layer and have a same thickness.

18. The display device according to claim 1, wherein a portion of the at least one planarization layer overlapping with the first sensor or the second sensor is thicker than another portion of the at least one planarization layer that does not overlap with the first sensor or the second sensor.

19. A display device comprising:
a first area in which one or more first pixels are disposed on a substrate;
a second area in which one or more second pixels are disposed of the substrate, the second area being adjacent to the first area; and
a first transistor disposed between a first pixel among the one or more second pixels and the substrate, and a second transistor disposed between a second pixel among the one or more second pixels and the substrate,
wherein the second area includes a first sensor area corresponding to a first sensor, and a second sensor area corresponding to a second sensor,
wherein a first blocking layer in the first sensor area is different than a second blocking layer in the second sensor area,
wherein the at least one substrate includes a first divot overlapping with the first sensor and a second divot overlapping with the second sensor,
wherein at least one planarization layer is disposed continuously across the first sensor and the second sensor, and
wherein the at least one planarization layer is disposed between the first transistor and the first pixel, the second transistor is disposed between the second blocking layer and the second pixel, and a portion of the at least one planarization layer fills at least one of the first divot and the second divot in the substrate.

20. A display device comprising:
a first area in which one or more first pixels are disposed;
a second area in which one or more second pixels are disposed, the second area being surrounded by the first area;
a polarizer disposed over the one or more first pixels and the one or more second pixels; and
a planarization layer disposed between a transistor and the one or more second pixels,
wherein the second area includes a first sensor area corresponding to a first sensor, and a second sensor area corresponding to a second sensor,
wherein a first blocking layer in the first sensor area is different than a second blocking layer in the second sensor area,
wherein the polarizer includes a first hole overlapping with the first sensor and a second hole overlapping with the second sensor, and
wherein a portion of the planarization layer extends through a hole in at least one of the first blocking layer and the second blocking layer.

\* \* \* \* \*